United States Patent
Ciraula et al.

[11] Patent Number: 6,150,834
[45] Date of Patent: Nov. 21, 2000

[54] ELIMINATION OF SOI PARASITIC BIPOLAR EFFECT

[75] Inventors: Michael Kevin Ciraula, Round Rock; Christopher McCall Durham; Peter Juergen Klim, both of Austin, all of Tex.

[73] Assignee: International Business Machines Corporation, Armonk, N.Y.

[21] Appl. No.: 09/190,556

[22] Filed: Nov. 12, 1998

[51] Int. Cl.[7] .......................... H03K 17/16; H03K 19/094
[52] U.S. Cl. ................................ 326/21; 326/21; 326/26; 326/27; 326/119; 326/121
[58] Field of Search .................. 326/21, 26, 27, 326/93, 95, 98, 106, 108, 113, 119, 121

[56] References Cited

U.S. PATENT DOCUMENTS

| | | | |
|---|---|---|---|
| 3,992,703 | 11/1976 | Luisi et al. | 340/173 R |
| 4,571,609 | 2/1986 | Hatano | 357/41 |
| 4,946,799 | 8/1990 | Blake et al. | 437/41 |
| 5,079,605 | 1/1992 | Blake | 357/23.7 |
| 5,483,181 | 1/1996 | D'Souza | 326/98 |
| 5,498,882 | 3/1996 | Houston | 257/57 |
| 5,594,371 | 1/1997 | Douseki | 326/119 |
| 5,635,745 | 6/1997 | Hoeld | 257/372 |
| 5,637,899 | 6/1997 | Eimori et al. | 257/347 |
| 5,654,573 | 8/1997 | Oashi et al. | 257/349 |
| 5,674,760 | 10/1997 | Hong | 437/24 |
| 5,729,039 | 3/1998 | Beyer et al. | 257/347 |
| 5,818,264 | 10/1998 | Ciraula et al. | 326/98 |
| 5,821,769 | 10/1998 | Douseki | 326/34 |
| 5,831,452 | 11/1998 | Nowak et al. | 326/98 |
| 5,870,411 | 2/1999 | Durham et al. | 371/22.5 |
| 5,903,500 | 5/1999 | Tsang et al. | 365/189.05 |

*Primary Examiner*—Michael Tokar
*Assistant Examiner*—Vibol Tan
*Attorney, Agent, or Firm*—Kelley K. Kordzik; Winstead Sechrest & Minick P.C.; Anthony V. S. England

[57] ABSTRACT

The present invention addresses the foregoing needs by providing a circuit implemented in SOI (silicon on insulator) CMOS, which includes a first node precharged to an activated level, a first transistor coupled between the first node and the second node, a second transistor coupled between the second node and a ground potential, and a third transistor coupled to the second node and operable for preventing the second node from rising to the activated level. The third transistor prevents the parasitic bipolar effect from raising this second node to the activated level. Essentially, the third transistor maintains the second node substantially at a ground level.

18 Claims, 4 Drawing Sheets

ELIMINATION OF SOI PARASITIC BIPOLAR EFFECT

TECHNICAL FIELD

The present invention relates in general to electronic circuitry, and in particular, to silicon on insulator (SOI) CMOS circuitry.

BACKGROUND INFORMATION

In n-well bulk CMOS (complementary metal oxide semiconductors) the n-well transistor source and drains are implanted into the p-substrate, and p-transistors are implanted into the n-well. The n-well has been previously implanted into the p-substrate. The diffusion capacitance of both source and drain consists of the perimeter term plus the area term between the implants and the substrate.

For a silicon-on-insulator ("SOI") CMOS structure, a buried oxide lies under the transistor. The source, drain and bulk are bound by the buried oxide layer on the bottom, and the bulk (body) is floating. This topology substantially reduces the diffusion capacitance of the source and drain. Hence, the device may perform at much higher speeds and lower power. Furthermore, due to the device structure, soft error susceptibility is reduced, latch-up is eliminated, and short channel effects are improved such that the device may be designed with a lower threshold voltage, therefore further increasing the operational speed of the device.

As SOI CMOS technology becomes available, high speed processors may take advantage of the increase in performance. There are, however, several problems associated with SOI that must be overcome by circuit design techniques. One of the SOI related problems is the parasitic bipolar effect. FIG. 1 illustrates a cross-section of an NMOS SOI transistor 100. A buried oxide layer 102 is deposited on a substrate 101. A p-doped layer of silicon 103 is then deposited on the buried oxide 102 and used as the bulk layer of the transistor 100. Between the center p-bulk portion 103 and an oxide portion 107, an n+ source 106 is created, while an n+ drain portion 104 is created between p-bulk 103 and an oxide portion 105. On top of the p-bulk 103 portion, a gate oxide 108 is deposited and then a material for operating as the gate electrode 109 is deposited on top of the gate oxide layer 108.

The bulk 103 consisting of p material is floating, unlike bulk CMOS circuits where the p-bulk is tied to ground. If the gate of the SOI NMOS device 100 is grounded as indicated, the device 100 is off. Vdd is applied to the drain 104, and the source 106 is left floating. Should this condition persist for a long time, drain 104 to body 103 junction leakage current and impact ionization generation near the drain gate region will eventually charge the bulk 103 to Vdd, and the source 106 will also float to Vdd over time. If switch S1 is closed, the source 106 is suddenly pulled to ground. This forward biases the bulk/source junction. As a consequence, the parasitic bipolar transistor consisting of the drain 104 (collector), bulk 103 (base), and source 106 (emitter) is turned on and current flows through the transistor 100 even though the gate 109 is tied to ground.

Referring next to FIG. 2, there is illustrated a prior art distributed output multiplexer 200 for a column of n bits in a register file, implemented in SOI CMOS. For simplicity, only a single column is shown; a general purpose register file may have 64 columns or more and as many as 128 or more rows.

The dynamic node 211 represents the bit line. A single write and single read port memory cell 250 is shown in detail, even though the number of read and write ports may be larger. The other illustrated memory cells 217 and 218 are only shown in block diagram form.

Only one row per port in the register file is accessed during a read. For instance, if the register file has 64 bits per row and 128 entries and 6 read ports, then between one and six rows (different ports may read from the same address) are read from during any read cycle. An individual row may be accessed to every cycle or not at all for a long time. However, it may be written to independently of the read operation.

The memory element consists of transistors 203–206. Memory cell0 250 is written to by issuing the write address wr0_addr, which turns on pass transistors 201 and 202. True and complement write data is presented on the wrdata0 and $\overline{\text{wrdata0}}$ inputs respectfully and passed into the memory cell 250 through pass transistors 201 and 202, respectively. After the differential write operation has been performed, the inverter consisting of PFET 207 and NFET 208 inverts the complement data, and if a 1 was written into the cell 250, then NFET 209 of the distributed output mux 200 is turned on.

Node 211 in distributed output mux 200 is precharged high when $\overline{\text{reset}}$ is low (see the timing diagram in FIG. 4), turning on PFET 223. Inverter 221 forces output dout low. This turns on transistor 222, which maintains the precharge condition for node 211 once the $\overline{\text{reset}}$ signal goes high. When at a later time the read address rd_addr0 goes high, node 211 is pulled down and output dout goes high, provided that a 1 was present in the memory cell 250 from a previous write operation.

If a 0 was written into cell0 250, the pull down path through device 210 is blocked because device 209 has been turned off. When the read address goes high, node 211 remains high and output dout remains low. Devices 210 and 209 form the pull down mux of cell0, devices 215 and 216 represent the pull down mux for cell1, and devices 220 and 219 represent the nth cell pull down mux (all cells are in the same column). Only cell0_column0 in conjunction with inverter 207, 208 and mux pull downs 210 and 209 are described. It should be understood that all cells in the array function identically.

For this discussion, the gate electrodes of devices 210 and 209 are both low, hence both transistors are off (0 has been written into cell0), and node 211 is precharged to Vdd. Assume now that the cell data has not been written to 1 for a long period of time (500 picoseconds; see FIG. 4) and no read operation has been performed. The bulk of device 210 becomes slowly charged to Vdd, and node 212 drifts up to the level of Vdd. If device 209 is suddenly turned on when a 1 is written into the memory cell0 (see FIG. 4), it will pull node 212 to ground. As a consequence, the bulk to source pn junction in device 210 is forward biased turning on the parasitic bipolar transistor of device 210 consisting of the drain (collector), bulk (base), and source (emitter). As a result current is flowing from the dynamic node 211 to ground.

A single parasitic bipolar transistor may be too weak to discharge the dynamic node 211. However, if a large number of ports are connected to node 211, all may exhibit the effects of the parasitic bipolar transistor simultaneously after being turned on in a single write cycle. The half latch 222 may now be too small to supply sufficient current to maintain the precharge state of node 211, and the output dout may rise to a level of 1. Even if the precharge state is maintained, the noise margin is substantially reduced. The result is additional power consumption which would be a major concern. Therefore, there is a need in the art for improved circuitry whereby parasitic bipolar effects are eliminated in an SOI circuit.

SUMMARY OF THE INVENTION

The present invention addresses the foregoing needs by providing a circuit implemented in SOI CMOS, which includes a first node precharged to an activated level, a first transistor coupled between the first node and the second node, a second transistor coupled between the second node and a ground potential, and a third transistor coupled to the second node and operable for preventing the second node from rising to the activated level. The third transistor prevents the parasitic bipolar effect from raising this second node to the activated level. Essentially, the third transistor maintains the second node substantially at a ground level (may be a threshold voltage above ground).

In another embodiment of the present invention, in a dynamic circuit, the present invention includes a method for coupling a precharged node to a first SOI CMOS transistor, coupling the first SOI CMOS transistor to a second node, coupling the second node to a ground potential through a third SOI CMOS transistor, and preventing the second node from rising to a level of the precharged node. This preventing step includes the step of coupling a third transistor to the second node to prevent a parasitic bipolar effect from raising the second node to the level of the precharged node.

In yet another embodiment of the present invention, a distributed multiplexer circuit is configured to operate in accordance with the above-described method.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
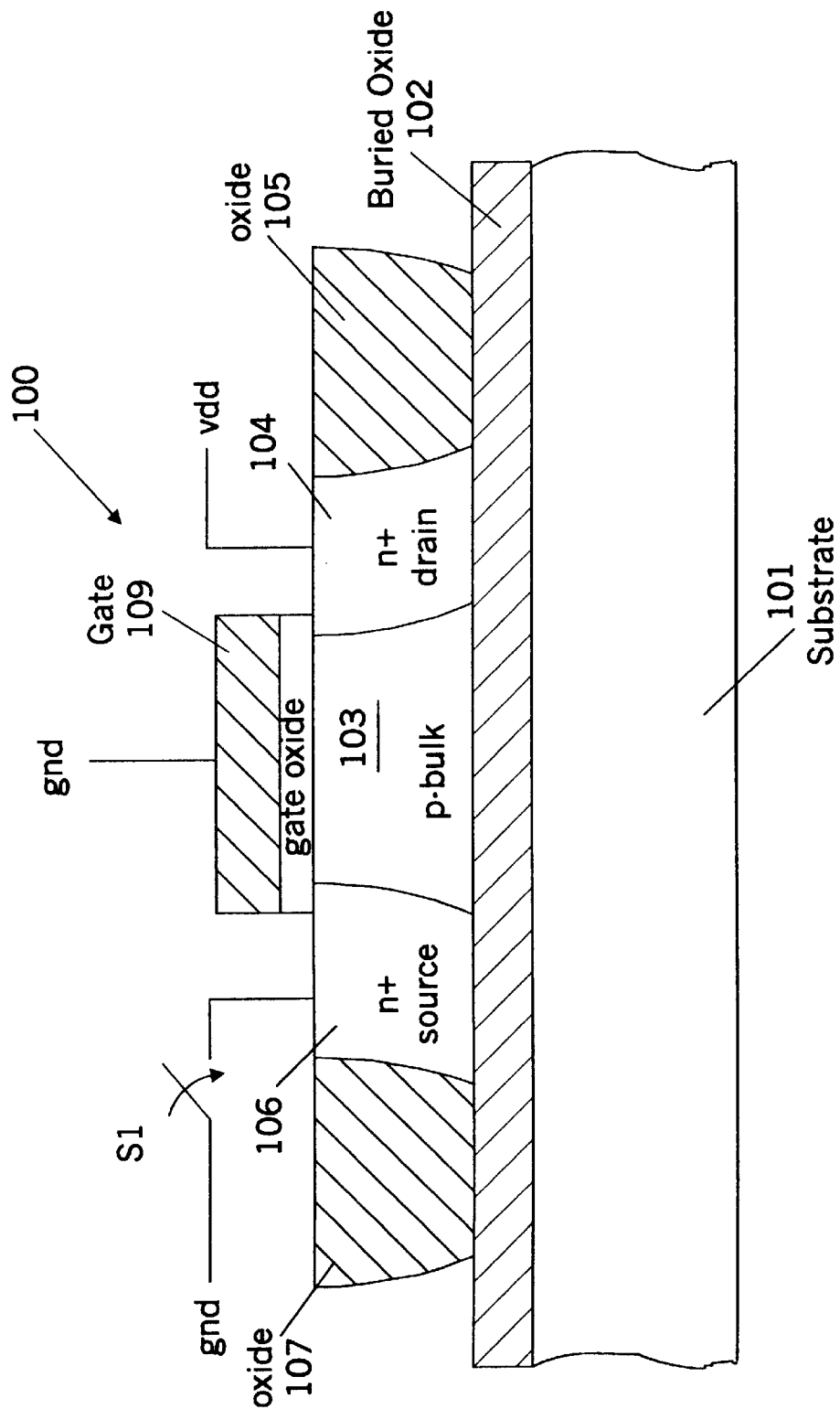
FIG. 1 illustrates an SOI transistor.
Figure 2:
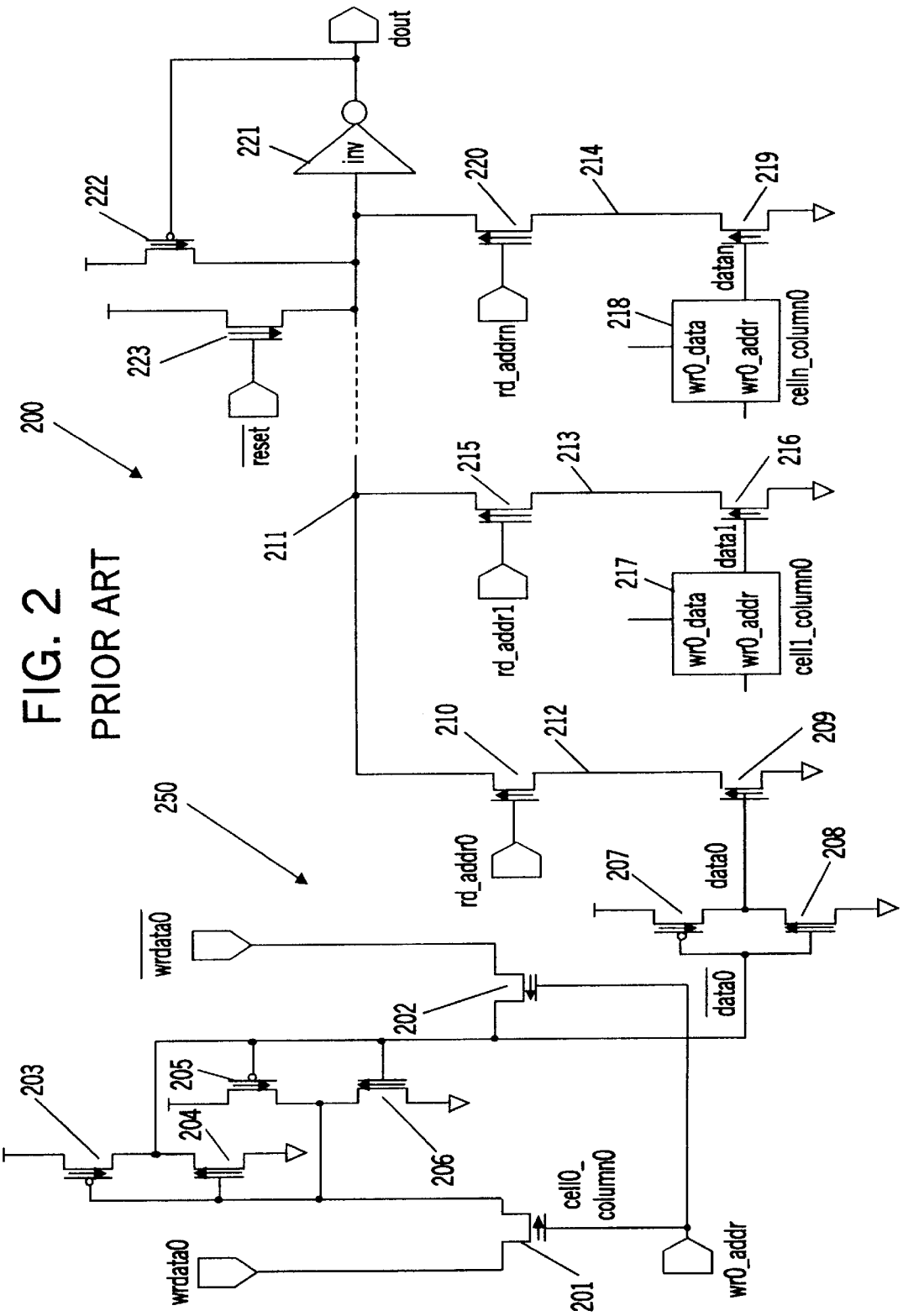
FIG. 2 illustrates a prior art distributed output multiplexer.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 3:
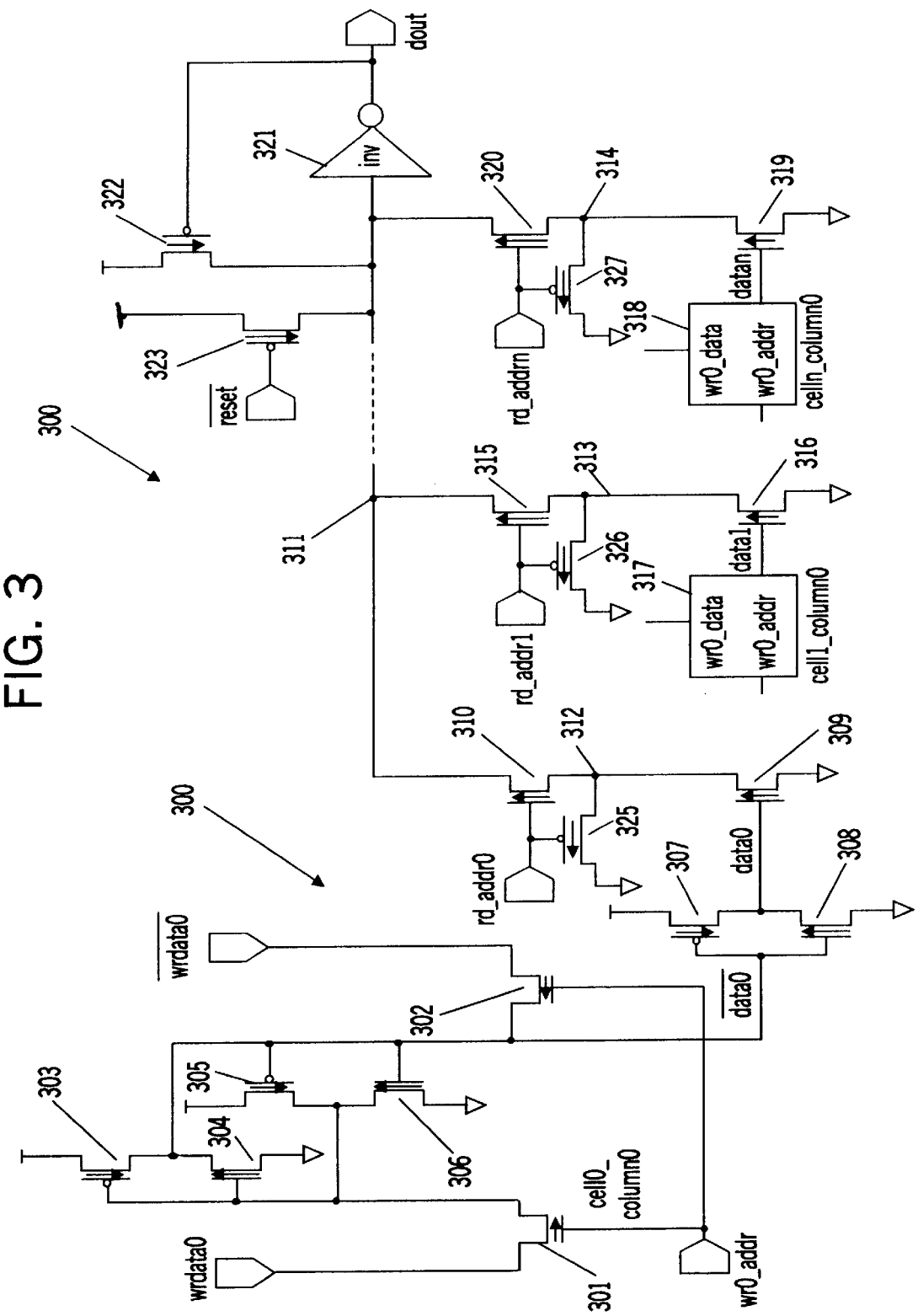
FIG. 3 illustrates a distributed multiplexer configured in accordance with the present invention.
Figure 4:
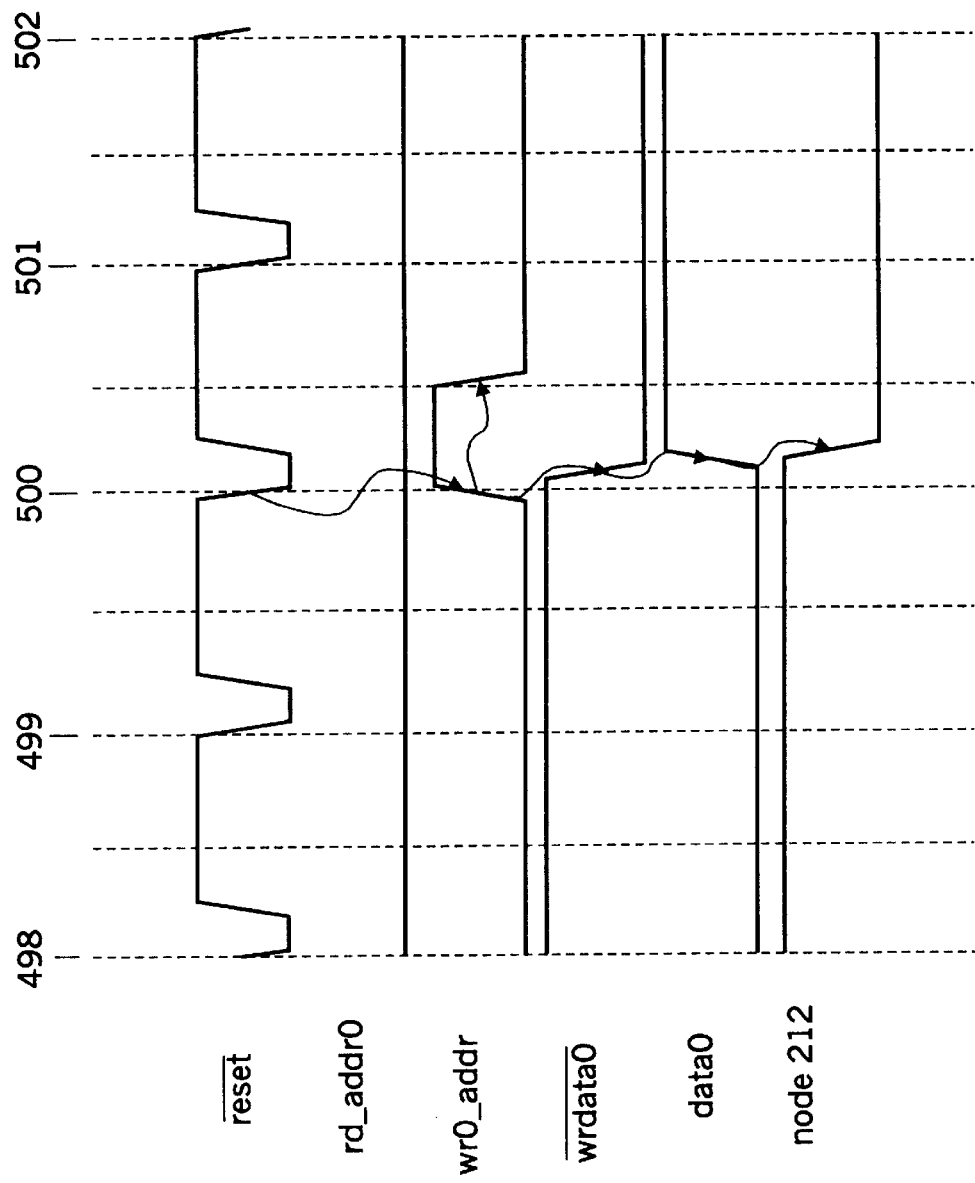
FIG. 4 illustrates a timing diagram.

Referring to FIG. 3, there is illustrated distributed multiplexer 300 configured in accordance with the present invention. P-channel device 325 is added for cell0, p-channel device 326 is added for cell1, and p-channel device 327 is added for celln. The gate electrodes of transistors 325–327 are connected to signals rd_addr0 through rd_addrn, respectively. The source electrodes of devices 325–327 are connected to ground, and the drain electrodes are connected to nodes 312–314, respectively. The remainder of devices 301–323 operated similarly as devices 201–223 except as described below.

When a row is not activated for a read operation, signals rd_addr0 through rd_addrn are at a 0 level, and p-channel devices 325–327 are on, keeping nodes 312–314 at a threshold voltage above ground. N-channel devices could replace the p-channel devices 325–327 with an inverter, which would keep the nodes 312–314 at a ground level.

The read address pulses are of such duration (200–400 picoseconds) that the p-channel devices are on most of the time. This implies that the nodes 312–314 can never float up to Vdd and the parasitic bipolar transistor in devices 310, 315, and 320 will never be able to turn on when ones are written into individual cells turning on transistors 309, 316, and 319, respectively, because no certain transition will pull down nodes 312–314.

An additional positive effect of this configuration is that it speeds up the pull down of the multiplexer tree during read operations because intermediate nodes 312–314 are already close to ground potential. Hence, read access time is reduced.

Even though the above discussion is in reference to register file output multiplexers, the same method applies to any dynamic circuit.

Although the present invention and its advantages have been described in detail, it should be understood that various changes, substitutions and alterations can be made herein without departing from the spirit and scope of the invention as defined by the appended claims.

What is claimed is:

1. A circuit implemented in SOI CMOS comprising:
   a first node precharged to an activated level;
   a first transistor coupled between the first node and a second node, wherein the first transistor is off;
   a second transistor coupled between the second node and a ground potential; and
   a third transistor coupled to the second node for preventing the second node from rising to the activated level, wherein the third transistor prevents a parasitic bipolar effect from raising the second node to the activated level.

2. The circuit as recited in claim 1, wherein the second transistor is off.

3. A circuit implemented in SOI CMOS comprising:
   a first node precharged to an activated level;
   a first transistor coupled between the first node and a second node;
   a second transistor coupled between the second node and a ground potential; and
   a third transistor coupled to the second node for preventing the second node from rising to the activated level, wherein the third transistor maintains the second node substantially at a ground level.

4. The circuit as recited in claim 2, wherein the first transistor is an NFET, the second transistor is an NFET, and the third transistor is a PFET with its gate electrode coupled to a gate electrode of the first NFET transistor and its drain electrode coupled to the ground potential and its drain electrode coupled to the second node.

5. A method comprising the steps of:
coupling a precharged node to a first SOI CMOS transistor;
coupling the first SOI CMOS transistor to a second node;
coupling the second node to a ground potential through a third SOI CMOS transistor; and
preventing the second node from rising to a level of the precharged node, wherein the preventing step includes the step of coupling a third transistor to the second node, wherein the third transistor prevents a parasitic bipolar effect from raising the second node to the level of the precharged node.

6. The method as recited in claim 5, wherein the first transistor is off.

7. The method as recited in claim 6, wherein the second transistor is off.

8. The method as recited in claim 5, wherein the third transistor maintains the second node substantially at a ground level.

9. The method as recited in claim 8, wherein the first transistor is an NFET, the second transistor is an NFET, and the third transistor is a PFET with its gate electrode coupled to a gate electrode of the first NFET transistor and its drain electrode coupled to the ground potential and its drain electrode coupled to the second node.

10. A multiplexor ("mux") implemented in SOI CMOS comprising:
a first node precharged to an activated level;
a first transistor coupled between the first node and a second node, wherein the first transistor is off;
a second transistor coupled between the second node and a ground potential; and
a third transistor coupled to the second node for preventing the second node from rising to the activated level, wherein the third transistor prevents a parasitic bipolar effect from raising the second node to the activated level.

11. The mux as recited in claim 10, wherein the second transistor is off.

12. The mux as recited in claim 11, wherein the third transistor maintains the second node substantially at a ground level.

13. The mux as recited in claim 12, wherein the first transistor is an NFET, the second transistor is an NFET, and the third transistor is a PFET with its gate electrode coupled to a gate electrode of the first NFET transistor and its drain electrode coupled to the ground potential and its drain electrode coupled to the second node.

14. The mux as recited in claim 13, further comprising a memory cell coupled to a gate electrode of the second transistor.

15. The mux as recited in claim 14, wherein the gate electrode of the first NFET transistor receives a read signal, and wherein the first node is coupled to an output of the mux.

16. A circuit implemented in SOI CMOS comprising:
a first node precharged to an activated level;
a first transistor coupled between the first node and a second node;
a second transistor coupled between the second node and a ground potential; and
a third transistor coupled to the second node for preventing the second node from rising to the activated level, wherein the third transistor prevents a parasitic bipolar effect from raising the second node to the activated level.

17. A method comprising the steps of:
coupling a precharged node to a first SOI CMOS transistor;
coupling the first-SOI CMOS transistor to a second node;
coupling the second node to a ground potential to a third SO CMOS transistor; and
preventing the second node from rising to a level of the precharged node, wherein the third transistor prevents a parasitic bipolar effect from raising the second node to the level of the precharged node.

18. A multiplexor ("mux") implemented in SOI CMOS comprising:
a first node precharged to an activated level;
a first transistor coupled between the first node and a second node;
a second transistor coupled between the second node and a ground potential; and
a third transistor coupled to the second node for preventing the second node from rising to the activated level, wherein the third transistor prevents a parasitic bipolar effect from raising the second note to the activated level.

* * * * *

UNITED STATES PATENT AND TRADEMARK OFFICE
CERTIFICATE OF CORRECTION

PATENT NO. : 6,150,834 Page 1 of 1
DATED : November 21, 2000
INVENTOR(S) : Michael Kevin Ciraula, Christopher McCall Durham and Peter Juergen Klim It is certified that error appears in the above-identified patent and that said Letters Patent is hereby corrected as shown below:

Column 5,
Lines 3 and 28, please replace "drain" with -- source --.
Line 10, please replace "third" with -- second --.

Column 6,
Line 3, please replace "drain" with -- source --.
Line 26, please replace "third" with -- second --.
Line 29, please replace "SO" with -- SOI --.

Signed and Sealed this

Twenty-ninth Day of July, 2003

JAMES E. ROGAN
*Director of the United States Patent and Trademark Office*